United States Patent [19]

Bensahel et al.

[11] 4,229,237
[45] Oct. 21, 1980

[54] METHOD OF FABRICATION OF SEMICONDUCTOR COMPONENTS HAVING OPTOELECTRONIC CONVERSION PROPERTIES

[75] Inventors: Daniel Bensahel, Grenoble; Jean-Claude Pfister, Saint Ismier; Louis Revoil, Seyssinet Pariset, all of France

[73] Assignee: Commissariat a l'Energie Atomique, Paris

[21] Appl. No.: 85,948

[22] Filed: Oct. 18, 1979

[30] Foreign Application Priority Data

Oct. 26, 1978 [FR] France ............................ 78 30497

[51] Int. Cl.³ .......................................... H01L 21/225
[52] U.S. Cl. .................................. 148/190; 148/187; 148/188
[58] Field of Search ................ 148/190, 188, 187, 1.5

[56] References Cited

U.S. PATENT DOCUMENTS

| | | | |
|---|---|---|---|
| 3,389,024 | 6/1968 | Schimmer | 148/190 X |
| 3,472,711 | 10/1969 | Chow | 148/186 |
| 3,670,220 | 6/1972 | Kun et al. | 148/190 X |
| 3,745,073 | 7/1973 | Kun et al. | 148/189 |
| 3,895,975 | 7/1975 | Lindmayer | 148/186 X |
| 3,911,469 | 10/1975 | Wrobel | 148/190 X |
| 4,038,111 | 7/1977 | Dumas | 148/188 X |

Primary Examiner—G. Ozaki
Attorney, Agent, or Firm—Pearne Gordon Sessions

[57] ABSTRACT

The top surface of a wafer of p-type ZnTe semiconductor material is subjected to double diffusion of an acceptor impurity and of a donor impurity so as to create in the ZnTe on the one hand a compensated region having high resistivity and on the other hand a surface injection region of small thickness, a metallic contact being finally formed on each face of the wafer.

14 Claims, 4 Drawing Figures

METHOD OF FABRICATION OF SEMICONDUCTOR COMPONENTS HAVING OPTOELECTRONIC CONVERSION PROPERTIES

The present invention has for its object a method of fabrication of semiconductor components having optoelectronic conversion properties, that is to say light-emitting or light-receiving properties and in some cases both properties at the same time.

In more precise terms, the present invention is concerned with a method of fabrication of semiconductor components of this type which are capable of emitting light having a well-defined wavelength and/or conversely which are capable of producing a current when said components are subjected to light radiation.

In even more precise terms, said components are obtained from p-type ZnTe semiconductor material.

A further object of the invention is to provide a method of fabrication of light-emitting and/or light-receiving semiconductor components in which the forward-bias control voltage for light emission is of relatively low value.

Another object of the invention is to provide a method of fabrication of a semiconductor component of this type which does not entail the need for ion implantation operations.

The problems which arose when conventional techniques were adopted for the fabrication of a diode having both light-emitting and light radiation-detecting properties have been explained in French patent Application No. EN 78/08522 filed on Mar. 28th, 1978 in the name of C. E. A. in respect of "A method of Fabrication of Electroluminescent and Photodetecting Diodes". It was shown in particular that the characteristics of the component for obtaining high efficiency for both emission and reception were contradictory in the field of conventional methods of fabrication. The reasons for this will be more readily understood by referring to the text of this document.

It is already a known practice to fabricate electroluminescent and photodetecting diodes from ZnTe material. A method of this type is described in particular in the French patent Application cited above. However, this method calls for ion implantation and, taking account of its structure, a relatively high forward-bias control voltage is necessary in order to perform this operation.

Methods of fabrication of electroluminescent diodes from ZnTe material are also known but these diodes have characteristics which are different from those which form the subject of the present invention.

Mention can be made of the article by Crowder (Appl. Physics Letters 8, 148, 1966) in which the efficiency was 2% in the green region but at 77° K. or the article published in J. Appl. Physics 44, 10, October 1973): the diodes described in this article were fabricated from an MIS structure and were green at 77° K. but yellow at room temperature.

In the method according to the invention, the starting material consists of a wafer of as-manufactured ZnTe semiconductor material which is therefore p-type. The top surface of said wafer is subjected to double diffusion of an acceptor impurity and of a donor impurity so as to create on the one hand a region having high resistivity and on the other hand a p-type surface injection region of small thickness. Finally, a metallic contact is formed on the bottom face of said wafer.

The double diffusion mentioned in the foregoing has a double function. On the one hand, diffusion of the donor impurity has the effect of producing a compensation of the starting ZnTe semiconductor material by creating a region of relatively high resistivity to a relatively substantial depth $x_j$. Double diffusion of the acceptor impurity and of the donor impurity has the intended function of forming a surface layer for the injection of electrons having a thickness $x_i < x_j$. By recombining with the holes, these electrons will produce light having a well-defined wavelength. In the electron injection region, there are obtained two further properties which are important for the operation of the semiconductor device, namely an increase in the number of acceptor centers and the achievement of high efficiency of recombination on a center resulting from said impurity.

Preferably, the donor impurity is aluminum. Said donor impurity can also consist of indium, indium oxide or zinc. Preferably, the acceptor impurity consists of lithium but can also consist of sodium or potassium.

In accordance with one mode of practical application, the double diffusion is carried out in an oxidizing medium.

Said oxidizing medium is preferably obtained by employing salts or bases or alkali metals which serve as acceptor impurities and have oxidizing properties. Among these can be mentioned : $LiNO_3$, $LiCO_3$, $LiCOOH$, $NaNO_3$, $NaCO_3$, $KNO_3$, $KCO_3$, $KOH$, ...

The oxidizing medium can also be formed by means of a gaseous medium which surrounds the semiconductor wafer at the time of the double diffusion operation.

A more complete understanding of the invention will in any case be gained from the following description of one embodiment of the semiconductor device according to the invention, reference being made to the accompanying drawings, wherein.

Figure 1:
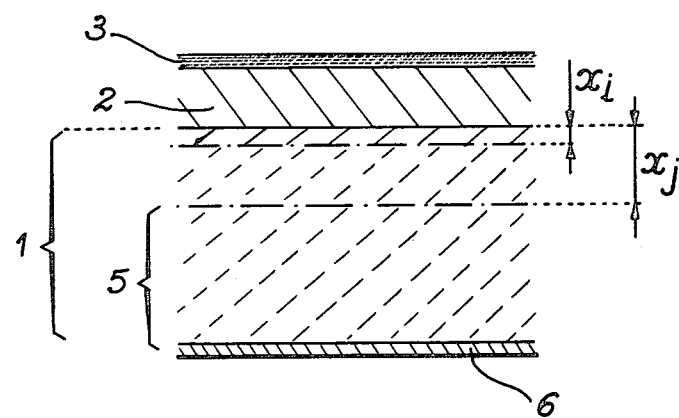
FIG. 1 is a vertical sectional view of a ZnTe wafer and illustrates the steps of the method.
Figure 2A:
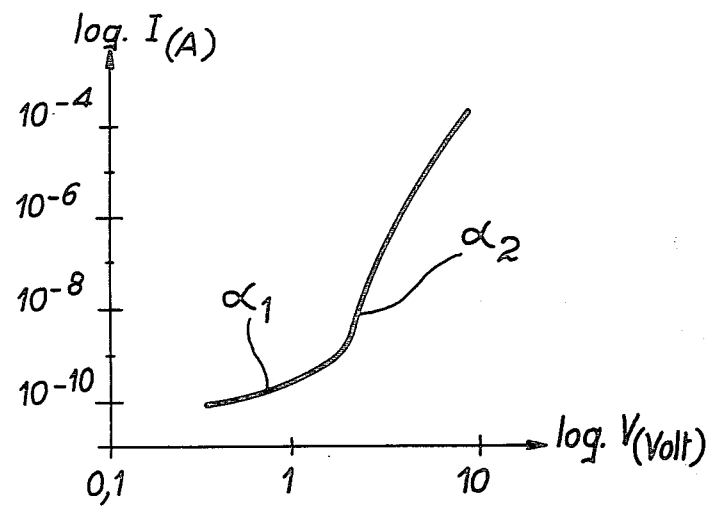
FIGS. 2a and 2b represent curves which illustrate the operation of the devices obtained by applying the method according to FIG. 1.
Figure 2B:
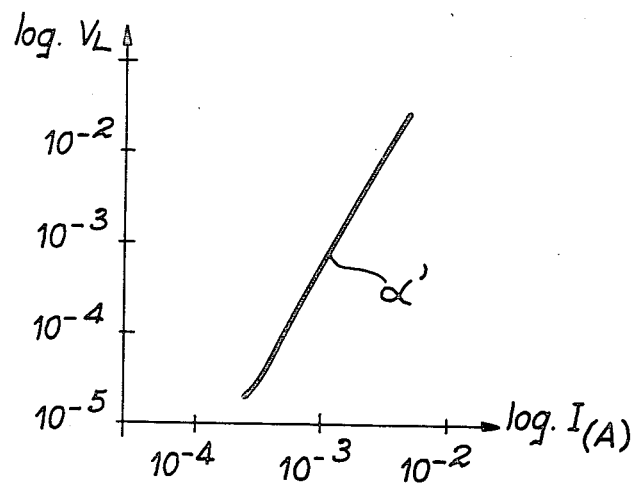

Referring to FIG. 1, a particular example of application of the method according to the invention will be described in the case in which double diffusion is carried out in an oxidizing medium. A starting element consisting of a wafer 1 of ZnTe having p-type conductivity is employed at the outset. A metallic layer 2 consisting of aluminum in this particular example is deposited on the top face of said wafer. Said layer 2 is etched so as to define the upper electrodes of the elementary components with which the wafer is intended to be provided. A deposit 3 of lithium nitrate is formed either before or after etching of said layer 2. To this end, there is deposited on the aluminum layer 2 a solution of $LiNO_3$, $H_2O$ (for example 0.01 mole of $LiNO_3$) or $LiNO_3$, $H_2O_2$ (20 volumes). The water or oxygenated water is allowed to evaporate. A few crystals of $LiNO_3$ remain at the surface of the aluminum. At the time of heating of the wafer which has thus been covered with these two top layers (for example within a furnace in which an inert gas such as $N_2$ or slightly hydrogenated $N_2$ is circulated) two diffusion processes take place. On the one hand, the aluminum layer diffuses into the ZnTe wafer to a depth $x_j$ so as to form a compensated region or in other words a region having high resistivity. This compensation results from a process which is characteristic of ZnTe with respect to metals such as aluminum; when ZnTe is doped, its resistivity increases by several decades by virtue of the association of defects which are present in the as-drawn crystal with the aluminum which has been introduced. The other intended function of the aforementioned diffusion is to improve the quality of contact between the ZnTe wafer and the metallic layer 2 consisting of aluminum in this particular example.

The impurity which diffuses at the time of heating through the metallic layer 2 obtained from the layer 3 penetrates into the wafer 1, thus resulting in an acceptor in the p-region of the ZnTe. This region becomes even more conductive than at the outset by virtue of the inflow of acceptor centers. Another function of the diffusion process is to create within the forbidden band of the ZnTe material a level which will determine the wavelength of recombination of the electrons with the holes, said electrons being derived either from the conduction band or from a level close to this latter.

The simultaneous diffusion process has the intended function of creating a surface layer which permits injection of electrons. This layer has a surface depth $x_i$ ($x_i << x_j$) and permits operation of the device.

The presence of an oxidizing agent in the source of impurities is conductive at the same time to the formation of an intermediate insulating thin film which forms an MIS structure. This structure is favorable to the injection of electrons and thus improves the quantum efficiency of the diode.

The bottom electrode 6 (of Au, for example) is then deposited on the rear face of the wafer.

The operation of the device thus obtained both as emitter and as receiver is as follows.

When forward bias is applied to said device, light emission takes place in accordance with the following mechanism: as long as the basic voltage of the device is below a predetermined threshold value, the current which flows through the junction is of very low value since it is limited by the space charge region which exists within the insulating region or compensated region. This current is essentially composed of holes which flow from that portion of the substrate 1 which has remained p-type and passes upwards towards the top metallic contact constituted by the layer 2. During the motion of said holes, they are trapped in the trapping or injection region having a thickness $x_i$. In consequence, the space charge density p within said trapping region becomes more and more positive as the bias is increased. Since the electric field in this region is directly related to the value of $\rho$ by the equation:

$$E = \int Q/\epsilon \, dx$$

where $\epsilon$ is the dielectric constant of the semiconductor) there comes a moment when, in the case of a charge $\rho_c$, the electric field at the interface between metal and trapping region of thickness $x_i$ attains a critical value $E_c$ beyond which the electrons can be injected by tunnel effect from the top contact to that portion 5 of the substrate 1 which has remained p-type. These electrons are entrained by the electric field which prevails in the insulating region of thickness $x_j$ and will undergo radiactive recombination within the substrate 5. The light thus produced emerges from the front face of the crystal and passes through the top metallic contact 2.

When the device is not biased or is reverse-biased, an electric field is located near the surface in the trapping region of thickness $x_i$ and in the insulating region of thickness $x_j$. As it falls on the front face, the light is absorbed to a very small depth of the order of 0.1 micron. In consequence, the electron-hole pairs are created directly within the region in which an intense electric field is maintained.

Said pairs are immediately subjected to the effect of the electric field and separated. Thus a photoelectric current flows within the external circuit of the device. A device of this type has very high detection efficiency since the electrons and the holes have a low probability of combination by virtue of the presence of the electric field within the thickness in which they are created.

It should be pointed out that, by virtue of the preliminary compensation of part of the ZnTe semiconductor material by diffusion of atoms of the top metallic layer 2, an insulating region $x_j$ of very high resisitivity is accordingly obtained. This high resistivity has the effect of improving the performances of this device to a very appreciable extent. It can thus be stated that, as the resisitivity of this insulating region is higher, so the hole current is lower, and so the injection efficiency in emission is correspondingly higher. In fact, the electrons injected from the contact to the substrate of ZnTe produce luminescence whereas the holes do not take part in said luminescence. Moreover, the electric field will be effective for collecting the carriers produced by the incident light at the time of operation of the device in detection.

Curves 2a and 2b illustrate the operation of devices of this type. Curve 2a gives the current I as a function of the voltage V, $I = V^\alpha$ (with $\alpha_1 \simeq 1.5$ and $\alpha_2 \simeq 15 \pm 3$). Curve 2b gives the emitted light power $V_L$ (collected on a photomultiplier, for example) as a function of the current I, $V_L = I^{\alpha'}$ (with $\alpha' \simeq 2$).

There has been described in the foregoing a preferred mode of execution of the method of deposition of an aluminum layer surmounted by a layer of lithium nitrate, these two layers being intended to produce double diffusion. However, other modes of operation make it possible to carry out the method in accordance with the invention.

In the first place, different compounds (salts or bases of alkali metals) can be employed in order to form the equivalent of the layer 3. By way of example, it is possible to employ $LiCO_3$, $LiCOOH$, $NaNO_3$, $KNO_3$, $KCO_3$, $KOH$, ..., these substances being present either in gaseous form in the environment of the conductive wafer or in liquid form at the time of heating of the metal deposit.

Similarly, in order to form the metallization layer 2, it is possible to employ substances other than aluminum provided that these substances give rise to compensation of the ZnTe material after a simple diffusion. Indium, zinc and indium oxide can be mentioned by way of example.

As stated earlier, the double diffusion process can be carried out in a medium which is not oxidizing. Said medium can be neutral or can even have a slightly reducing action.

Similarly, instead of depositing two separate layers corresponding to the acceptor and donor impurties, it is possible in some cases to form an alloy between these two materials and thus to deposit a single layer.

Figure 3:
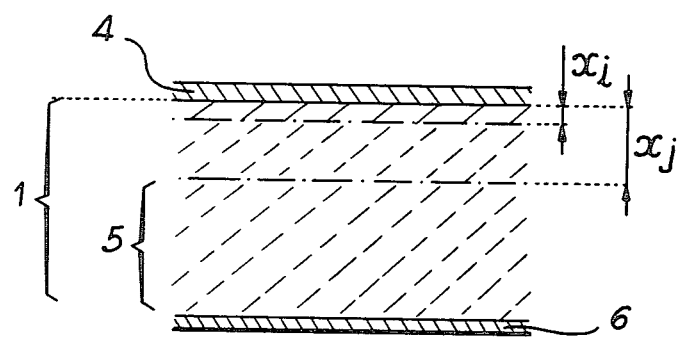
FIG. 3 is a vertical sectional view of another embodiment of the method according to the invention.

There will be described hereinafter an example of execution corresponding to deposition of a single layer and to double diffusion in a neutral medium, reference being made to FIG. 3.

In a first step, an aluminum-lithium alloy containing 10% lithium is formed. This alloy is produced in the conventional manner, either in a vacuum or in a reducing atmosphere.

A layer 4 of said alloy is deposited on the ZnTe substrate 1 by vacuum evaporation. Said layer 4 preferably has a thickness of 1 micron. This thickness could vary between 0.5 and 3 microns.

The complete assembly is heated to 500° C. in a neutral atmosphere in order to produce double diffusion of the elements contained in the layer 4. In a more general manner, this operation can be carried out at a temperature within the range of 450° C. to 600° C. After double diffusion which results in the same doping regions as those of FIG. 1, the electrodes are then connected.

It must also be emphasized than, by virtue of its structure, said device operates by injection of electrons. In consequence, the control voltage is of low value.

A further point worthy of note is that the operation and emission of green light are practically independent of the temperature at which the device is operated.

If the invention which forms the subject of the present patent Application is compared with the method described in French patent Application No. 78 08522 of Mar. 28th, 1978, the following points can be noted. The electron injection region which has a thickness $x_i$ is smaller in width than the region created by ion implantation of the patent application cited above. In consequence, the control voltage is lower. Furthermore, the method in accordance with the present invention does not entail the need for any ion implantation operation. The defects which are liable to be created by ion implantation are therefore not encountered in the starting semiconductor material ZnTe, even if the greater part of these defects is in fact localized within the top metallic layer through which implanatation is effected.

Moreover, the semiconductor devices obtained by carrying out the method in accordance with the invention permit a wide range of potential applications.

The devices in accordance with the invention which have both electroluminescent and photodetecting properties have many potential applications by reason of the fact that, in addition, a large number of elementary devices of this type can be formed on a single substrate. Among such applications can be mentioned the construction of a screen for visual display and data reading. This screen is constituted by a matrix of discrete and individually addressable devices and is capable of displaying a set of data in much the same manner as a cathode-ray screen while at the same time performing the function of an image pickup tube if the screen is operated in the detection mode. In these two operating modes, it is necessary to incorporate an electronic decoding circuit.

A further example which is worthy of mention is the construction of a system for writing and reading documents. By projecting the image of each discrete device on photosensitive paper, it is possible to reconstitute a coded electrical signal on a utilizable medium (paper). Similarly, by projecting onto each discrete device the image of a document to be read, it would be possible to obtain an electrical signal which is proportional to the quantity of light received by each point (video signal). From this point of view, the semiconductor devices in accordance with the invention can serve as reading and writing elements in remote datatransmission systems of the type employed for remote copying, remote data processing and so forth.

We claim:

1. A method of fabrication of a semiconductor component having optoelectronic conversion properties, wherein said method comprises the following steps:
    (a) there is employed at the outset a wafer of p-type ZnTe semiconductor material;
    (b) the top surface of said wafer is subjected to double diffusion of an acceptor impurity and of a donor impurity so as to create in ZnTe on the one hand a compensated region having high resistivity and on the other hand a surface injection region of small thickness; and
    (c) a metallic contact is formed on both faces of said wafer.

2. A method according to claim 1, wherein the donor impurity is aluminum.

3. A method according to claim 1, wherein the donor impurity is selected from the group comprising indium, zinc, indium oxide.

4. A method according to claim 1, wherein the acceptor impurity is lithium.

5. A method according to claim 1, wherein the acceptor impurity is selected from the group comprising potassium and sodium.

6. A method according to claim 1, wherein a layer of the substance which constitutes or provides the donor impurity is deposited on the top surface of the wafer aforesaid and serves at the same time as a top electrode.

7. A method according to claim 6, wherein a layer of a substance containing the acceptor impurity is deposited on the layer of the substance which constitutes or provides the donor impurity.

8. A method according to claim 1, wherein said double diffusion is performed in an oxidizing medium.

9. A method according to claim 8, wherein the substance which provides the acceptor impurity is a salt or a base havig oxidizing properties of a metal selected from the group comprising lithium, potassium and sodium.

10. A method according to claim 8, wherein the oxidizing medium is contained in the environment of the wafer when said wafer is subjected to double diffusion.

11. A method of fabrication of a semiconductor component having eletroluminescent and photodetecting properties, wherein said method comprises the following steps:
    (a) there is employed at the outset a wafer of p-type ZnTe semiconductor material;
    (b) a layer of aluminum is deposited on the top face of said wafer;
    (c) a layer of $LiNO_3$ is deposited on the top face of the aluminum layer;
    (d) the complete assembly is heated so as to obtain double diffusion of the aluminum and of the lithium; and
    (e) a second electrode is deposited on the bottom face of the wafer.

12. A method according to claim 11, wherein the aluminum layer is etched between steps (b) and (c).

13. A method according to claim 11, wherein the aluminum and $LiNO_3$ layers are etched between steps (c) and (d).

14. A method of fabrication of a semiconductor component having electroluminesecent and photodetecting properties, wherein said method comprises the following steps:

(a) aluminum-lithium alloy is formed;
(b) a layer of alloy is deposited on the top face of a wafer of p-type ZnTe semiconductor material;
(c) the complete assembly is heated so as to obtain double diffusion of the aluminum and of the lithium; and
(d) a second electrode is deposited on the bottom face of the wafer.

* * * * *

UNITED STATES PATENT AND TRADEMARK OFFICE
CERTIFICATE OF CORRECTION

PATENT NO. : 4,229,237

DATED : October 21, 1980

INVENTOR(S) : Daniel Bensahel, Jean-Claude Pfister and Louis Revoil

It is certified that error appears in the above—identified patent and that said Letters Patent are hereby corrected as shown below:

Column 2, line 26, delete "or" second occurrence and insert --of--.
Column 3, line 27, delete "conductive" and insert --conducive--.
Column 5, line 18, delete "than" and insert --that--;
line 68, delete "datatransmission " and insert --data-transmission--.
Column 6, line 39, delete "havig" and insert --having--.
Column 7, line 3, before "alloy" insert --said--.

Signed and Sealed this

Twenty-seventh Day of January 1981

[SEAL]

Attest:

Attesting Officer

RENE D. TEGTMEYER

Acting Commissioner of Patents and Trademarks